United States Patent
Kobayashi et al.

(10) Patent No.: US 11,092,635 B2
(45) Date of Patent: Aug. 17, 2021

(54) ELECTROMAGNETIC FIELD PROBE

(71) Applicant: Mitsubishi Electric Corporation, Tokyo (JP)

(72) Inventors: Tsuyoshi Kobayashi, Tokyo (JP); Chiharu Miyazaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 15 days.

(21) Appl. No.: 16/348,936

(22) PCT Filed: Jan. 27, 2017

(86) PCT No.: PCT/JP2017/002923
§ 371 (c)(1),
(2) Date: May 10, 2019

(87) PCT Pub. No.: WO2018/138868
PCT Pub. Date: Aug. 2, 2018

(65) Prior Publication Data
US 2019/0339317 A1    Nov. 7, 2019

(51) Int. Cl.
*G01R 29/08* (2006.01)
(52) U.S. Cl.
CPC .............................. *G01R 29/0878* (2013.01)
(58) Field of Classification Search
CPC ..... G01R 29/0878; G01R 31/302; H01Q 7/00
See application file for complete search history.

(56) References Cited

U.S. PATENT DOCUMENTS

| | | | | |
|---|---|---|---|---|
| 6,028,558 | A * | 2/2000 | Van Voorhies | ........... H01Q 1/36 343/742 |
| 2005/0253576 | A1* | 11/2005 | Nyce | .................... G01D 5/2216 324/207.17 |

(Continued)

FOREIGN PATENT DOCUMENTS

| | | |
|---|---|---|
| JP | 11-44719 A | 2/1999 |
| JP | 2005-351890 A1 | 12/2005 |

(Continued)

OTHER PUBLICATIONS

Office Action issued in corresponding German Application No. 11 2017 006 526.7 dated Mar. 24, 2020.

(Continued)

*Primary Examiner* — Akm Zakaria
(74) *Attorney, Agent, or Firm* — Birch, Stewart, Kolasch & Birch, LLP

(57) ABSTRACT

An electromagnetic field probe includes one continuous conductor line having terminals at both ends of the one continuous conductor line and including 2N (N is an integer greater than or equal to 3) conductors radially extending from a point near the center of the electromagnetic field probe, the one continuous conductor line being not short-circuited in the middle and being formed by connecting an end portion of a conductor included in the 2N conductors to an end portion of another conductor included in the 2N conductors, and two conductors included in the 2N conductors are disposed at positions at which the two conductors face each other with the point near the center present between the two conductors, and end portions of the two conductors close to the point near the center are connected to each other.

11 Claims, 9 Drawing Sheets

(56) References Cited

U.S. PATENT DOCUMENTS

| | | |
|---|---|---|
| 2005/0264284 A1 | 12/2005 | Wang et al. |
| 2007/0063717 A1* | 3/2007 | Funato .................. G01R 15/148 |
| | | 324/754.03 |
| 2007/0075908 A1* | 4/2007 | Ganeshan ................ H01Q 9/16 |
| | | 343/797 |
| 2007/0177414 A1 | 8/2007 | Funato et al. |
| 2009/0322326 A1 | 12/2009 | Ito et al. |
| 2010/0073020 A1 | 3/2010 | Lim et al. |
| 2011/0068777 A1* | 3/2011 | Tiemann .............. G01D 5/2053 |
| | | 324/207.15 |
| 2015/0318772 A1* | 11/2015 | Jahshan ................ H02K 21/24 |
| | | 318/400.41 |

FOREIGN PATENT DOCUMENTS

| | | |
|---|---|---|
| JP | 2007-187539 A | 7/2007 |
| JP | 2010-8282 A | 1/2010 |
| JP | 2010-78597 A | 4/2010 |
| JP | 2011-24168 A | 2/2011 |
| JP | 2011-64590 A | 3/2011 |
| WO | WO 2016/18999 A1 | 12/2016 |

OTHER PUBLICATIONS

Kobayashi et al., "A study of magnetic probe for signal trace on PCB." IEICE Communications Society Conference, 2015, B-4-18, total 3 pages.

* cited by examiner

0-DEGREE WIRING LINE

45-DEGREE WIRING LINE

90-DEGREE WIRING LINE

135-DEGREE WIRING LINE

FRONT SIDE

PERSPECTIVE VIEW

UNDERSIDE

ELECTROMAGNETIC FIELD PROBE

FIELD

The invention relates to an electromagnetic field probe that measures an electromagnetic field generated from a measurement target.

BACKGROUND

One of schemes generally used as detection schemes for an electromagnetic field probe is a loop antenna. A conventional loop antenna has a loop structure formed in a single plane, and by disposing the loop antenna such that a magnetic flux generated from a measurement target passes through a loop surface, an induced current is generated in a loop, by which a current flowing through the measurement target is detected (e.g., Patent Literature 1).

In a loop structure formed in a single plane such as that described in Patent Literature 1, in a case of measuring a current on a board wiring line, when a loop surface is perpendicular to a board and is oriented parallel to a wiring line direction, a magnetic flux generated by a current on the wiring line passes through the loop surface and can be detected. However, when the loop surface is oriented perpendicular to the wiring line direction, a magnetic flux does not pass through the loop surface and thus cannot be detected. Therefore, the angle of a probe (the angle of the loop surface) needs to be changed according to the orientation of a wiring line which is a measurement target.

In addition, there is also devised a loop structure in which a loop formed in a single plane is twisted at 180 degrees and the center of the loop is disposed on a board wiring line to measure a current flowing through the wiring line (e.g., Patent Literature 2). In this loop antenna, in a case of a structure in which a loop formed in a single plane such as that described in FIG. 5 of Patent Literature 2 is twisted at 180 degrees and conductors at an intersection portion of two loops are parallel to each other, when the linear intersection portion is disposed so as to be oriented along a board wiring line, magnetic fluxes in opposite directions pass through the two loops. As a result, due to the loop being twisted, induced currents generated in the two loops are induced in directions in which the induced currents strengthen each other, enabling to detect a current flowing through the wiring line. However, when the orientation of the linear intersection portion is orthogonal to the board wiring line, magnetic fluxes in opposite directions pass through the two loops, and cancel each other out, and thus, a current flowing through the wiring line cannot be detected. Namely, as in the example of Patent Literature 1, there is a problem that the angle of a probe (the angle of a loop surface) needs to be changed according to the orientation of a wiring line which is a measurement target.

For this problem, Patent Literature 3 devises a loop structure that supports magnetic fluxes in two different orthogonal directions by combining two orthogonal loops. When two orthogonal loops are combined together as described in Patent Literature 3, currents on wiring lines in two orthogonal directions can be detected without changing the angle of a probe.

In addition, Non Patent Literature 1 shows an electromagnetic field probe characterized in that two linear conductors are roughly orthogonal to each other so as not to be short-circuited, and of the two linear conductors, one end of one linear conductor is connected to one end of the other linear conductor by a conductor and the remaining other ends are also likewise connected to each other by a conductor, by which one continuous loop is formed, and the one continuous loop is cut off at any one point to provide terminals that draw a detection current generated in the loop. When two linear conductors such as those described in FIG. 1 of Non Patent Literature 1 (which are considered a single conductor, though terminals are obtained by cutting a central portion of one linear conductor in FIG. 1 of Non Patent Literature 1) are included in part of the loop, by allowing the orientation of either one of the two linear conductors to match the orientation of a board wiring line, a current flowing through the wiring line can be detected, and thus, detection for wiring lines in directions differing by 90 degrees can be performed without changing the orientation of the loop.

CITATION LIST

Patent Literature

Patent Literature 1: Japanese Patent Application Laid-open No. 2007-187539
Patent Literature 2: Japanese Patent Application Laid-open No. 2010-078597
Patent Literature 3: Japanese Patent Application Laid-open No. 2011-024168

Non Patent Literature

Non Patent Literature 1: Kobayashi Tsuyoshi et al., "A Study of Magnetic Probe for Signal Trace on PCB", 2015 IEICE Society Conference, B-4-18.

SUMMARY

Technical Problem

When two orthogonal loops such as those described in Patent Literature 3 are combined together, currents on wiring lines in two orthogonal directions can be detected without changing the angle of the probe. However, there is a problem that, for example, a current flowing through a wiring line that passes through a central axis O in FIG. 2 of Patent Literature 3 and has an angle of 135 degrees clockwise from an X-axis of XYZ-coordinate axes illustrated in the drawing cannot be detected because induced currents generated in two loop surfaces are induced in directions in which the induced currents cancel each other out.

In addition, a loop antenna described in Non Patent Literature 1, too, when a wiring line which is a measurement target is at 135 degrees (a diagonal wiring line in a direction from lower right to upper left in FIG. 1 of Non Patent Literature 1), magnetic fluxes in opposite directions pass through two loops, and cancel each other out, and thus, a current flowing through the wiring line cannot be detected. Namely, the loop antenna of Non Patent Literature 1 has a problem that although the loop antenna can detect currents on wiring lines at 0 degrees, 45 degrees, and 90 degrees without changing its orientation, the loop antenna cannot detect a current on a wiring line at 135 degrees.

The invention is made to solve the problem, and an object of the invention is to implement an electromagnetic field probe capable of detecting currents on board wiring lines disposed in various directions such as 0 degrees, 45 degrees, 90 degrees, and 135 degrees, without changing the orientation of the probe.

Solution to Problem

An electromagnetic field probe according to the invention is an electromagnetic field probe including one continuous conductor line having terminals at both ends of the one continuous conductor line and including 2N (N is an integer greater than or equal to 3) conductors radially extending from a point near a center of the electromagnetic field probe, the one continuous conductor line being not short-circuited in middle and being formed by connecting an end portion of a conductor included in the 2N conductors to an end portion of another conductor included in the 2N conductors, in which two conductors included in the 2N conductors are disposed at positions at which the two conductors face each other with the point near the center present between the two conductors, and end portions of the two conductors close to the point near the center are connected to each other.

Advantageous Effects of Invention

According to the electromagnetic field probe of the invention, currents on board wiring lines disposed in various directions such as 0 degrees, 45 degrees, 90 degrees, and 135 degrees can be detected without changing the orientation of the probe.

DESCRIPTION OF EMBODIMENTS

First Embodiment

Figure 1:
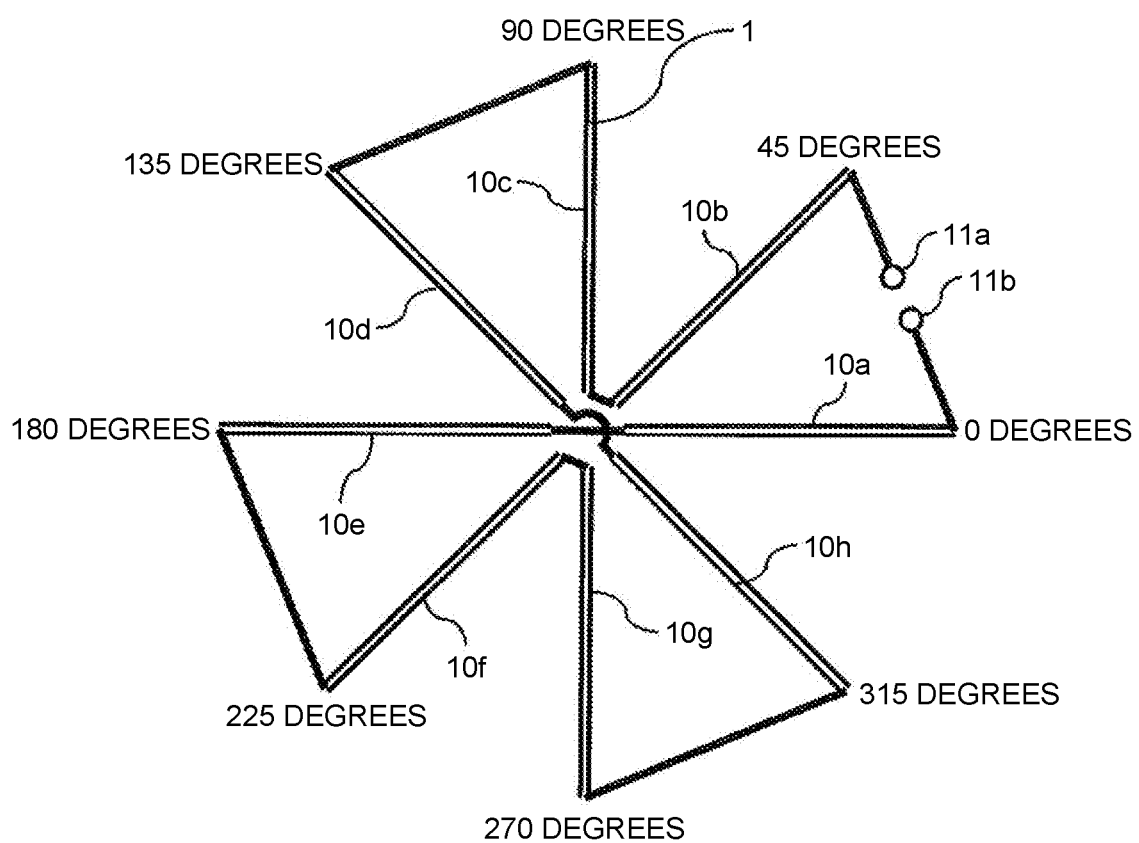
FIG. 1 is a configuration diagram of a loop-shaped conductor 1 included in an electromagnetic field probe according to a first embodiment.

FIG. 1 is a diagram illustrating a structure of a loop-shaped conductor (hereinafter, a loop) 1 included in an electromagnetic field probe of the invention. In FIG. 1, linear conductors 10a to 10h are radially disposed from a point near the center of the electromagnetic field probe at an angle of roughly 45 degrees with respect to each other, and form a loop which is one continuous conductor line having terminals at both ends thereof and connected so as not to be short-circuited in the middle. Furthermore, terminals 11a and 11b that draw a detection current generated in the loop are provided in the one continuous loop. Here, there are 2N linear conductors in total, and the linear conductors 10a to 10h correspond to n (=1, 2, . . . , 2N)th linear conductors, respectively. Note that FIG. 1 illustrates an example of a case of N=4. In addition, the two linear conductors 10a and 10e are disposed at positions at which the linear conductors 10a and 10e face each other with the point near the center of the loop-shaped conductor 1 present therebetween, and end portions of the linear conductors 10a and 10e close to the point near the center are connected to each other.

Figure 2:
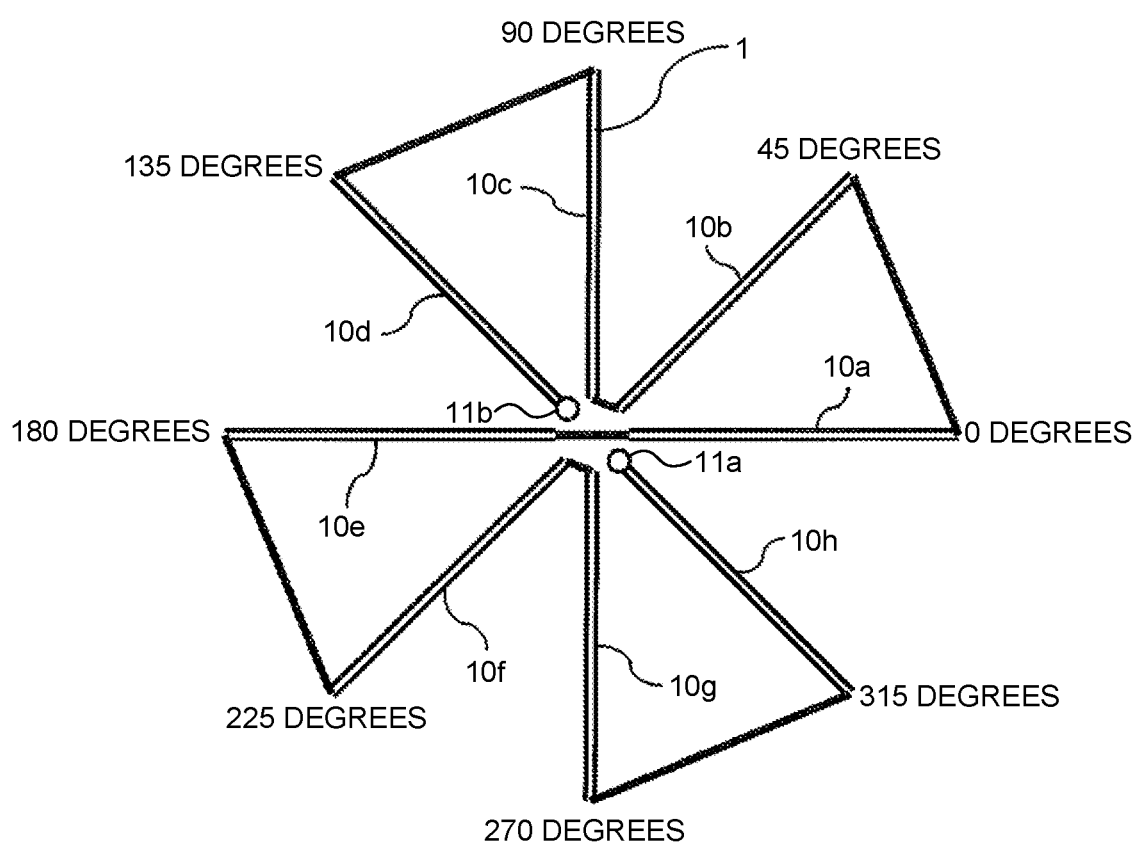
FIG. 2 is a diagram illustrating another loop structure according to the first embodiment.

FIG. 2 is a diagram illustrating another loop structure of the invention. The structure of FIG. 2 differs from that of FIG. 1 in that the terminals 11a and 11b are located at end points on the center side of the linear conductors 10d and 10h. By this structure, an intersection portion is eliminated, and a loop wiring line can be formed in a single plane.

Note that although, in both FIGS. 1 and 2, the linear conductors 10a to 10h each are indicated by a double line and conductors connecting the end points of the linear conductors 10a to 10h each are indicated by a single line, the conductors are indicated by different lines only for convenience of description, and thus, the conductors do not need to be formed of different conductor lines.

In FIGS. 1 and 2, an n (=1, 2, . . . , 2N−1)th linear conductor and an n+1th linear conductor are adjacent to each other, and among N pairs of linear conductors, each of which includes a 2m−1th linear conductor and a 2mth linear conductor (m=1, 2, . . . , N), in at least N−1 pairs, one ends of respective two linear conductors included in each pair are connected to each other. In addition, some linear conductors are connected at their other ends different than the one ends to linear conductors included in different pairs. In addition, the one ends are located farther from the center of the electromagnetic field probe than the other ends. In addition, the 2N linear conductors have a rotationally symmetric shape. Note that although FIGS. 1 and 2 illustrate examples of electromagnetic field probes of the invention and conditions satisfying the examples, the invention is not limited to those that satisfy all of the conditions.

The structure of the loop 1 of the present embodiment is such that four small triangular loops are combined together.

Next, using the loop structure of FIG. 2, the principle of detecting a current flowing through a wiring line will be described. FIG. 3 is a diagram in which the loop 1 of the present invention described in FIG. 2 is disposed on a wiring line 30 in which feeding and signal transmission are performed.

Figure 3A:
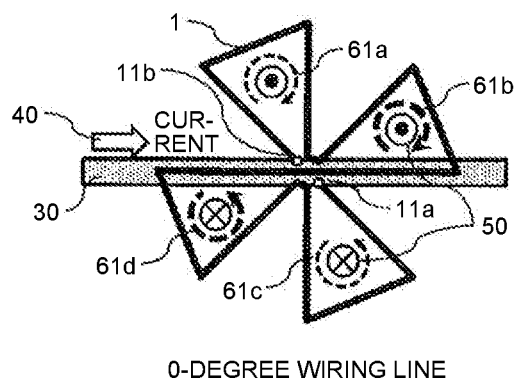
FIG. 3 is a diagram in which the loop-shaped conductor 1 of the present invention is disposed on a wiring line 30 in the first embodiment.

FIG. 3(a) illustrates a state in which the loop 1 is disposed on a wiring line whose horizontal direction is 0 degrees. When a current 40 from the left to right direction such as that illustrated in the drawing flows through the wiring line 30, clockwise magnetic fluxes 50 are generated around the wiring line 30, according to the right-hand screw rule. A magnetic flux represented by a circle with a black dot at the center thereof indicates that the magnetic flux is directed upward from the bottom on the paper, and a magnetic flux represented by a circle with "x" at the center thereof indicates that the magnetic flux is directed downward from the top on the paper. At this time, induced currents in directions such as 61a to 61d are generated in four triangular loop portions forming the loop 1. Here, the dashed lines of the induced currents 61b and 61d being thicker than those of 61a and 61c indicates that the induced currents 61b and 61d are larger. This occurs because the magnetic flux density increases as the position of a magnetic flux generated by the current 40 flowing through the wiring line 30 gets closer to the wiring line 30, and the numbers of magnetic fluxes passing through each triangular loop portion differ from each other. Induced currents for a 0-degree wiring line such as that of FIG. 3(a) are all induced to the loop 1 in the same direction along a conductor path, and the current 40 flowing through the wiring line 30 can be detected using an induced current obtained by combining the induced currents 61a to 61d.

Figure 3B:
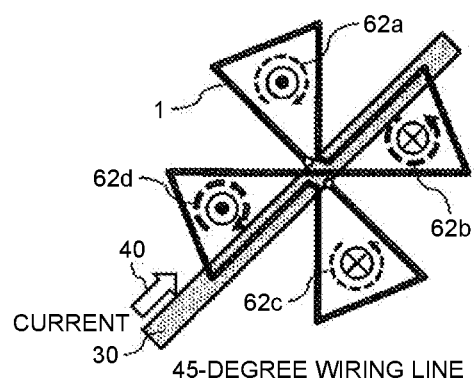

FIG. 3(b) illustrates a state in which the loop 1 is disposed on a wiring line in a 45-degree direction. Magnetic fluxes generated by the current 40 flowing through the wiring line 30 are the same as those of FIG. 3(a), and thus, description thereof is omitted. At this time, induced currents in directions such as 62a to 62d are generated in four triangular loop portions forming the loop 1. Here, the induced currents 62a and 62c are in opposite directions to the directions of the induced currents 62b and 62d, and the induced currents 62a and 62c and the induced currents 62b and 62d are in directions in which they cancel each other out, but since the induced currents 62b and 62d are larger due to the magnetic flux density, the current 40 flowing through the wiring line 30 can be detected using an induced current obtained by combining the induced currents 61a to 61d.

Figure 3C:
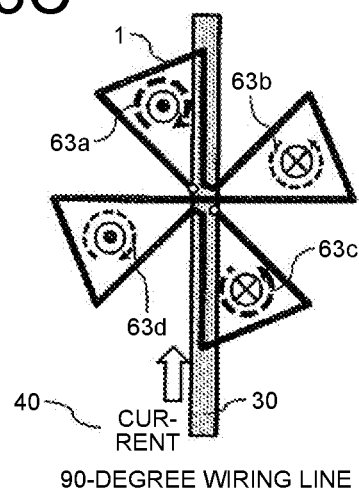

FIG. 3(c) illustrates a state in which the loop 1 is disposed on a wiring line in a 90-degree direction. Magnetic fluxes generated by the current 40 flowing through the wiring line 30 are the same as those of FIG. 3(a), and thus, description thereof is omitted. At this time, induced currents in directions such as 63a to 63d are generated in four triangular loop portions forming the loop 1. Here, the induced currents 63b and 63d are in opposite directions to the directions of the induced currents 63a and 63c, and the induced currents 63b and 63d and the induced currents 63a and 63c are in directions in which they cancel each other out, but since the induced currents 63a and 63c are larger due to the magnetic flux density, the current 40 flowing through the wiring line 30 can be detected using an induced current obtained by combining the induced currents 63a to 63d.

Figure 3D:
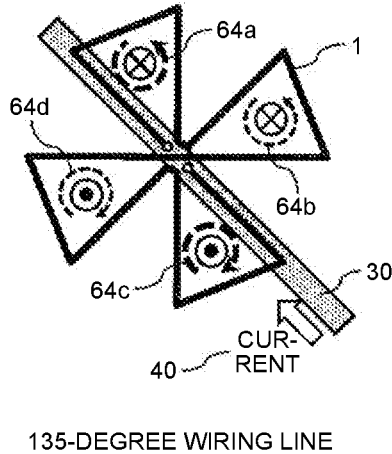

FIG. 3(d) illustrates a state in which the loop 1 is disposed on a wiring line in a 135-degree direction. Magnetic fluxes generated by the current 40 flowing through the wiring line 30 are the same as those of FIG. 3(a), and thus, description thereof is omitted. At this time, induced currents in directions such as 64a to 64d are generated in four triangular loop portions forming the loop 1. The induced currents 64a to 64d are all induced to the loop 1 in the same direction along a conductor path, and the current 40 flowing through the wiring line 30 can be detected using an induced current obtained by combining the induced currents 64a to 64d.

In addition to the above, in a case of a 180-degree wiring line, the direction of the current 40 of FIG. 3(a) becomes opposite, and the directions of magnetic fluxes become also opposite, but the current can be detected by the same principle as that described in FIG. 3(a). Likewise, in a case of a 225-degree wiring line, a 270-degree wiring line, and a 315-degree wiring line, a current can be detected by the same principle as that described for the 45-degree wiring line of FIG. 3(b), the 90-degree wiring line of FIG. 3(c), and the 135-degree wiring line of FIG. 3(d), respectively.

As described above, one continuous loop 1 in which eight linear conductors are radially disposed at an angle of roughly 45 degrees and are connected so as not to be short-circuited in the middle as illustrated in FIG. 1 or 2 can detect a current flowing through a wiring line, with the center of the loop 1 disposed directly above the wiring line and without changing the orientation of the loop 1, even if the wiring line is in any of the 0-degree, 45-degree, 90-degree, 135-degree, 180-degree, 225-degree, 270-degree, 315-degree, and 360-degree directions. In addition, even if the wiring line is at any other angle, whether there is a current can be detected as long as a condition that induced currents generated in four triangular loop portions completely cancel each other out is not satisfied. Furthermore, though not illustrated, when magnetic fluxes pass through all four triangular loop portions in the same direction and at the same density, induced currents generated in the four triangular loop portions completely cancel each other out, and thus, an influence by a distant magnetic field is not received.

Note that in FIG. 1 the terminals 11a and 11b are provided at positions between end points of the linear conductors 10a and 10b on the side far from the center, but may be provided at any position on one continuous loop. As illustrated in FIG. 2, by providing the terminals 11a and 11b at positions at which conductors connecting end points on the center side of linear conductors intersect each other, a loop wiring line can be formed in a single plane.

Figure 4:
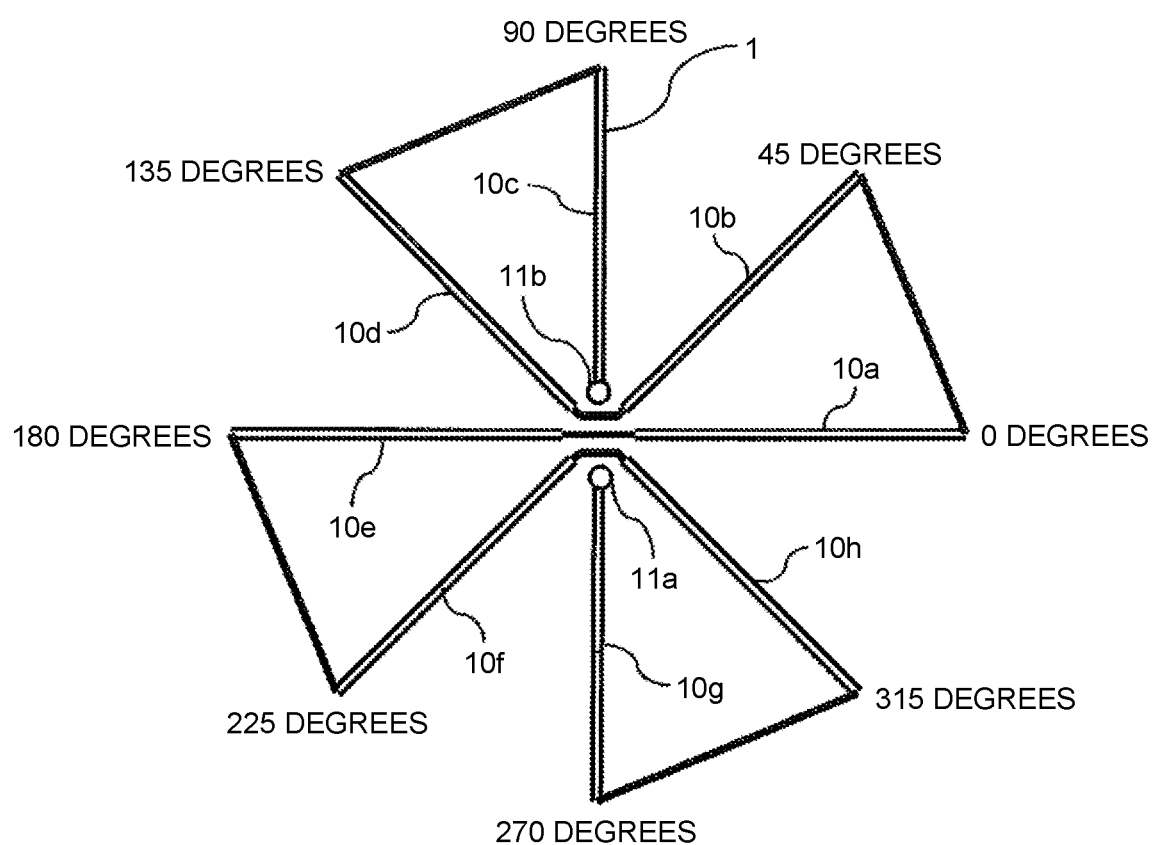
FIG. 4 is a diagram illustrating another loop structure according to the first embodiment.

In addition, when the linear conductors 10a to 10h are formed as one continuous loop 1 illustrated in FIG. 4, too, by the same principle, a current flowing through a wiring line can be detected with the center of the loop 1 disposed directly above the wiring line and without changing the orientation of the loop 1, even if the wiring line is in any of the 0-degree, 45-degree, 90-degree, 135-degree, 180-degree, 225-degree, 270-degree, 315-degree, and 360-degree directions. Even if the wiring line is at any other angle, whether there is a current can be detected as long as a condition that induced currents generated in four triangular loop portions completely cancel each other out is not satisfied.

In addition, although in the embodiment the linear conductors 10a to 10h are conductors having the same distance from the center of the radial disposition and having the same length, the configuration is not limited thereto. Furthermore, although the linear conductors are disposed at intervals of roughly 45 degrees, the intervals are not limited to 45-degree intervals. In addition, any number of linear conductors may be used as long as the number is an even number greater than or equal to 6. Namely, 2N (N is an integer greater than or equal to 3) linear conductors can be used.

Although, in the embodiment, description is made using the linear conductors 10a to 10h, instead of the linear conductors 10a to 10h, conductors including curves can also be used. For example, it is also possible to use one continuous conductor line having curves in a propeller-like shape, and the linear conductors 10a to 10h can be replaced by general conductors.

As such, an electromagnetic field probe of the present embodiment is characterized in that the electromagnetic field probe includes one continuous conductor line having terminals at both ends thereof and including 2N (N is an integer greater than or equal to 3) conductors radially extending from a point near the center of the electromagnetic field probe, the one continuous conductor line being not short-circuited in the middle and being formed by connecting an end portion of a conductor included in the 2N conductors to an end portion of another conductor included in the 2N conductors, and two conductors included in the 2N conductors are disposed at positions at which the two conductors face each other with the point near the center present therebetween, and end portions of the two conductors close to the point near the center are connected to each other. Here, for the "two conductors disposed at positions at which the two conductors face each other with the point near the center present therebetween", the two conductors are not limited to those placed facing each other at a 180° position with respect to the center of the electromagnetic field probe (e.g., the linear conductors 10a and 10e of FIGS. 1 and 2), and may be those located at 135° or 90° with respect to the center of the electromagnetic field probe. According to the electromagnetic field probe of the invention, currents on board wiring lines disposed in various directions such as 0 degrees, 45 degrees, 90 degrees, and 135 degrees can be detected without changing the orientation of the probe.

In addition, the electromagnetic field probe of the present embodiment is characterized in that an n (=1, . . . , 2N−1)th conductor included in the 2N conductors and an n+1th conductor are adjacent to each other, and among N pairs of conductors, each of which includes a 2m−1th conductor and a 2mth conductor (m=1, 2, . . . , N), in at least N−1 pairs, one ends of respective two conductors included in each pair are connected to each other, and some conductors are connected at their other ends different than the one ends to conductors included in different pairs. By using this configuration, with a simple probe configuration, currents on board wiring lines disposed in various directions can be detected without changing the orientation of the probe. Particularly, in a case of N=4, currents on board wiring lines in various directions including 0 degrees, 45 degrees, 90 degrees, and 135 degrees can be detected without changing the orientation of the probe.

In addition, the electromagnetic field probe of the present embodiment is characterized in that the one ends are farther from the center of the electromagnetic field probe than the other ends. By using this configuration, a simpler probe configuration can be obtained compared to a case in which the one ends are closer to the center of the electromagnetic field probe than the other ends.

In addition, the electromagnetic field probe of the present embodiment is characterized in that the 2N conductors have a rotationally symmetric shape. By using this configuration, the 2N conductors are disposed uniformly for all directions, enabling to eliminate an orientation of a board wiring line in which detection cannot be performed.

In addition, the electromagnetic field probe of the present embodiment is characterized in that the orientation of an n (=1, 2, . . . , 2N−1)th conductor included in the 2N conductors and the orientation of an n+1th conductor have a 360/(2N)-degree angle difference. By using this configuration, the 2N conductors are disposed uniformly for all directions, enabling to eliminate an orientation of a board wiring line in which detection cannot be performed.

In addition, the electromagnetic field probe of the present embodiment is characterized in that N=4. By using this configuration, currents on board wiring lines in the 0-degree, 45-degree, 90-degree, and 135-degree directions can be detected.

In addition, the electromagnetic field probe of the present embodiment is characterized in that N=4, an end portion of a p (=1, 3, 5, and 7)th conductor far from the center of the electromagnetic field probe is connected to an end portion of a p+1th conductor far from the center of the electromagnetic field probe, and an end portion of a q (=2 and 6)th conductor close to the center of the electromagnetic field probe is connected to an end portion of a q+1th conductor close to the center of the electromagnetic field probe, and an end portion of the first conductor close to the center of the electromagnetic field probe is connected to an end portion of the fifth conductor close to the center of the electromagnetic field probe. By using this configuration, a simple probe configuration can be obtained.

In addition, the electromagnetic field probe of the present embodiment is characterized in that a combination of end portions of the 2N conductors close to the center of the electromagnetic field probe or a combination of end portions of the 2N conductors far from the center of the electromagnetic field probe is present on the same circumference. By using this configuration, the 2N conductors have a uniform shape for all directions, enabling to easily dispose the electromagnetic field probe upon disposing the electromagnetic field probe in various environments.

In addition, the electromagnetic field probe of the present embodiment is characterized in that the one continuous conductor line is formed in the same plane. By using this configuration, a simple and easy-to-handle electromagnetic field probe can be formed.

In addition, the electromagnetic field probe of the present embodiment is characterized in that the 2N conductors are linear conductors. By using this configuration, a simple and easy-to-handle electromagnetic field probe can be formed.

Second Embodiment

In the present embodiment, an embodiment of a different loop structure than that of the first embodiment is shown.

Figure 5:
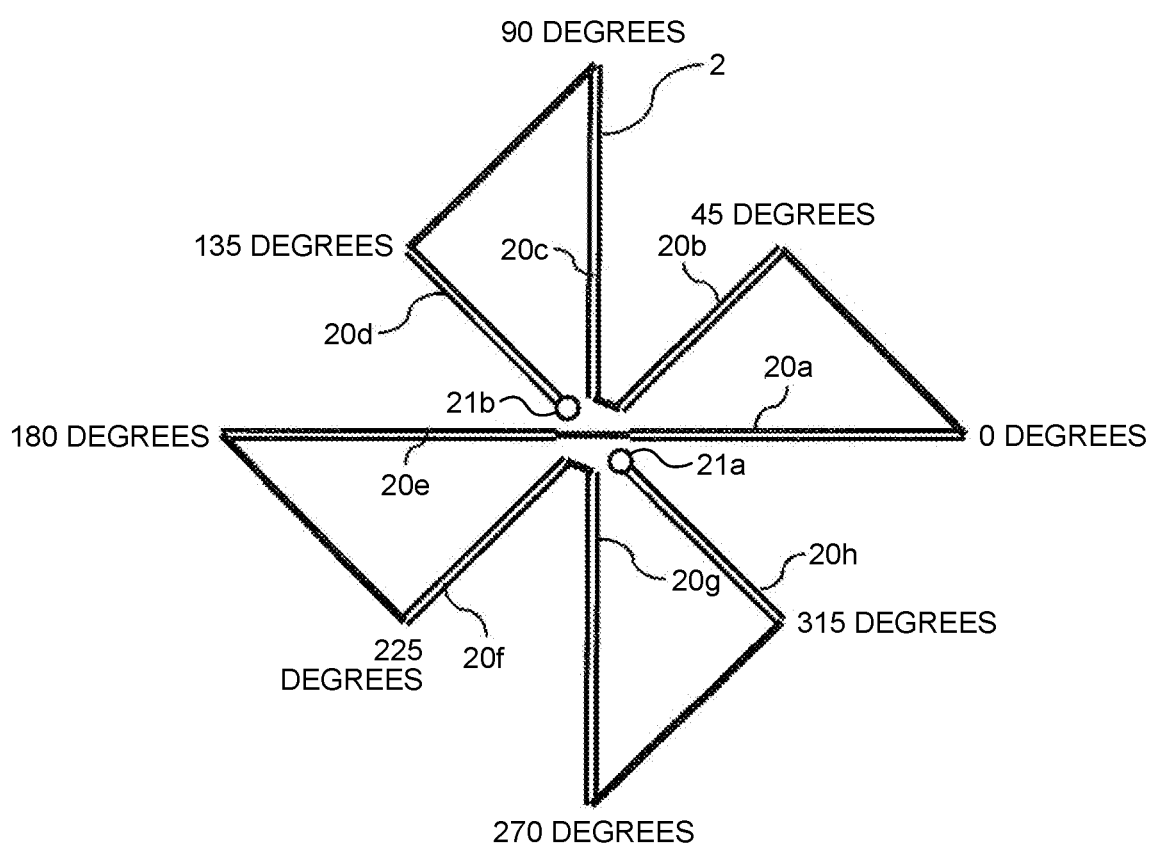
FIG. 5 is a configuration diagram of a loop-shaped conductor 2 of an electromagnetic field probe according to a second embodiment.

FIG. 5 is a diagram illustrating a loop structure of a loop-shaped conductor (hereinafter, a loop) 2 of an electromagnetic field probe of the second embodiment. The structure of FIG. 5 differs from that of FIG. 2 in that a loop is formed such that linear conductors 20a, 20c, 20e, and 20g have the same length and linear conductors 20b, 20d, 20f, and 20h have a length that is $1/\sqrt{2}$ of the length of other linear conductors.

Even with such a structure, a current flowing through a wiring line can be detected by the same principle as the detection principle illustrated in FIG. 3 of the first embodiment. Therefore, a current flowing through a wiring line can be detected with the center of the loop 2 disposed directly above the wiring line and without changing the orientation of the loop 2, even if the wiring line is in any of the 0-degree, 45-degree, 90-degree, 135-degree, 180-degree, 225-degree, 270-degree, 315-degree, and 360-degree directions. In addition, even if the wiring line is at any other angle, whether there is a current can be detected as long as a condition that induced currents generated in four triangular loop portions completely cancel each other out is not satisfied.

Figure 6:
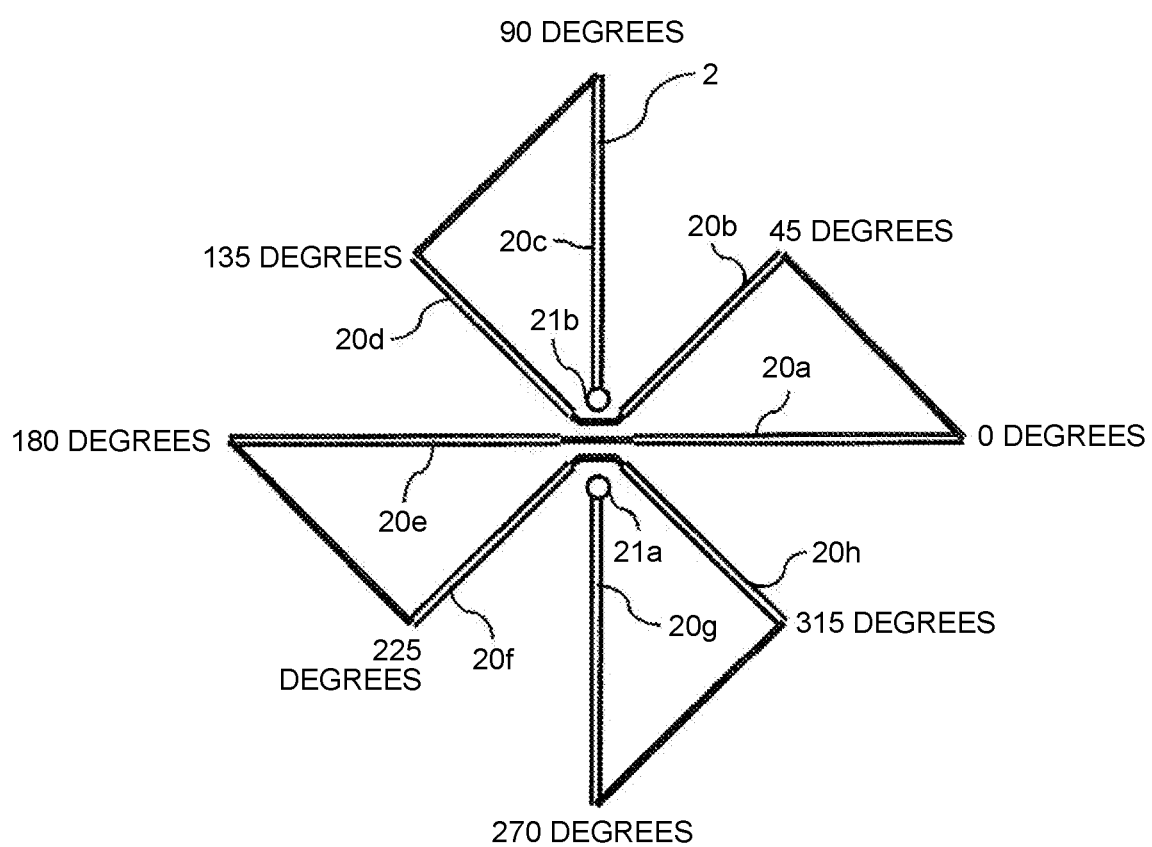
FIG. 6 is a diagram illustrating another loop structure according to the second embodiment.

In addition, when one continuous loop 2 illustrated in FIG. 6 is formed, too, by the same principle, a current flowing through a wiring line can be detected with the center of the loop disposed directly above the wiring line and without changing the orientation of the loop 2, even if the wiring line is in any of the 0-degree, 45-degree, 90-degree, 135-degree, 180-degree, 225-degree, 270-degree, 315-degree, and 360-degree directions. Even if the wiring line is at any other angle, whether there is a current can be detected as long as a condition that induced currents generated in four triangular loop portions completely cancel each other out is not satisfied.

Note that in both of the loop structures of FIGS. 5 and 6, when magnetic fluxes pass through all four triangular loop portions in the same direction and at the same density, induced currents generated in the four triangular loop portions completely cancel each other out, and thus, an influence by a distant magnetic field is not received.

By using this structure, when multiple loops 2 are disposed in a two-dimensional plane, the loops 2 can be disposed more densely. An example of the case in which the loops 2 are disposed densely is shown in a fourth embodiment.

Although, in the embodiment, description is made using the linear conductors 20a to 20h, instead of the linear conductors 20a to 20h, conductors including curves can also be used. For example, it is also possible to use one continuous conductor line having curves in a propeller-like shape, and the linear conductors 20a to 20h can be replaced by general conductors.

As such, the electromagnetic field probe of the present embodiment is characterized in that an orientation of an n (=1, 2, . . . , 2N−1)th conductor included in 2N conductors and an orientation of an n+1th conductor have a 360/(2N)-degree angle difference, and odd-numbered conductors included in the 2N conductors have a first length and even-numbered conductors have a second length. By this configuration, when multiple loops are disposed in a two-dimensional plane, the loops can be disposed more densely.

Particularly, when the first length is √2 times the second length, multiple loops can be disposed densely in a two-dimensional plane.

Third Embodiment

The first and second embodiments show examples in which a loop is formed of only conductors. On the other hand, the present embodiment shows an example of manufacturing a loop with a single-sided board as a more specific implementation method.

Figure 7B:
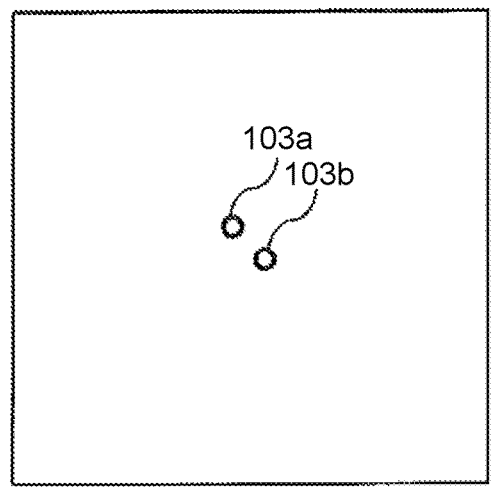
FIG. 7 is a diagram illustrating a state in which a loop wiring line is formed as a conductor pattern on one side of a printed circuit board in a third embodiment.
Figure 7A:
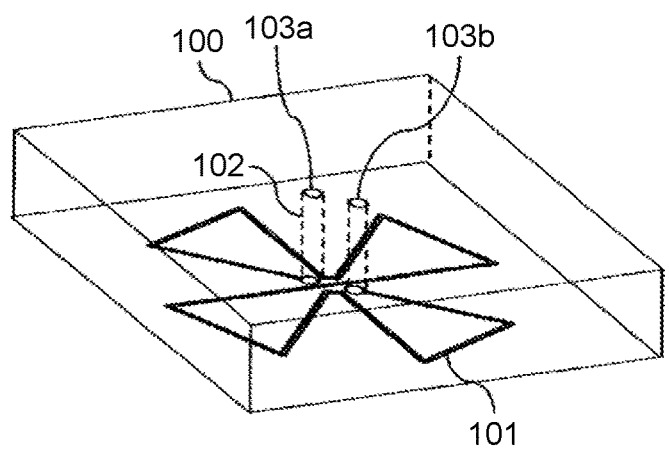
Figure 7C:
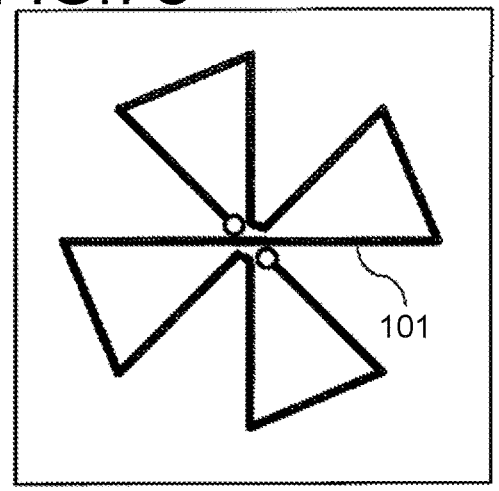

FIG. 7 is a diagram illustrating a state in which a loop wiring line is formed as a conductor pattern on one side of a printed circuit board. FIG. 7(a) is a perspective view of a structure in which the loop structure illustrated in FIG. 2 of the first embodiment is formed as a conductor pattern 101 on the underside of a printed circuit board 100, and terminals 103a and 103b are exposed on the front side via through-holes 102. FIG. 7(b) illustrates a pattern on the front side of the same printed circuit board, and FIG. 7(c) illustrates a pattern on the underside.

A conventional technique has a problem that when a loop is manufactured with a printed circuit board, a structure is complex. In addition, there is another problem that the size of a loop structure is limited by the thickness of a board that can be manufactured.

On the other hand, a loop structure of the present invention can be wired in a single plane which is only a single layer of a printed circuit board, and thus, manufacturing can be easily performed at low cost. In addition, the loop structure of the present invention does not have a problem, either, that the size of the loop structure is limited by the thickness of a board that can be manufactured.

As such, an electromagnetic field probe of the present embodiment is characterized in that the one continuous conductor line is formed as a conductor pattern which is a single layer of a printed circuit board. By this configuration, an electromagnetic field probe can be easily manufactured at low cost.

Fourth Embodiment

Although the first to third embodiments show examples of the configurations and manufacturing of loops alone, the present embodiment shows examples of a disposition method for a case of disposing multiple loops.

Figure 8:
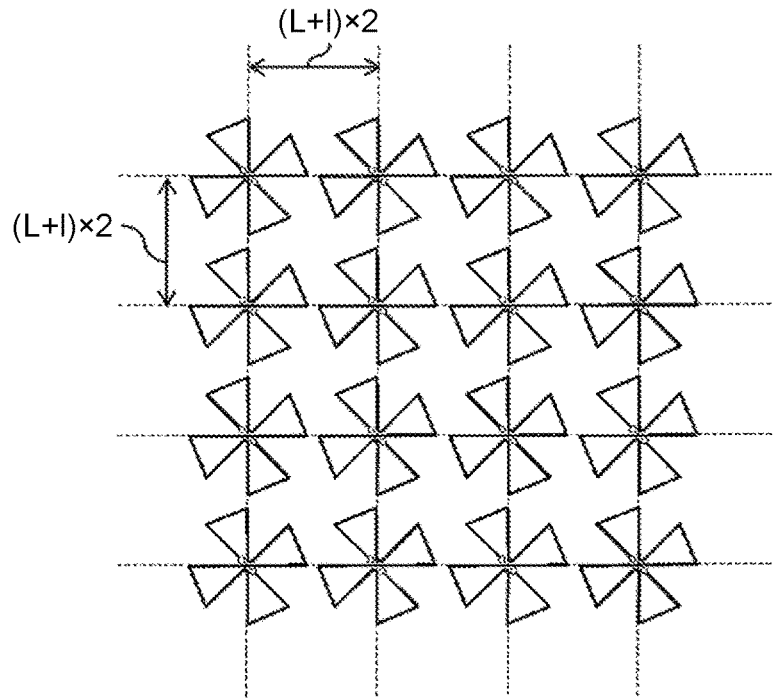
FIG. 8 illustrates an example of a case in which multiple loops illustrated in FIG. 2 are disposed in the same plane in a fourth embodiment.

FIG. 8 illustrates an example of a case in which multiple loops 1 illustrated in FIG. 2 are disposed in the same plane. Here, a distance between an end point of each of four linear conductors disposed at 0 degrees, 90 degrees, 180 degrees, and 270 degrees on the far side from a center point and the center point is L, minute spacing provided so that, when a plurality of loops 1 are disposed in a two-dimensional plane, the loops 1 do not contact each other (are not short-circuited) is I, and n is an integer, and the {X, Y} coordinates of the center point of each loop 1 are {(L+I)×2n, (L+I)×2n}.

Figure 9:
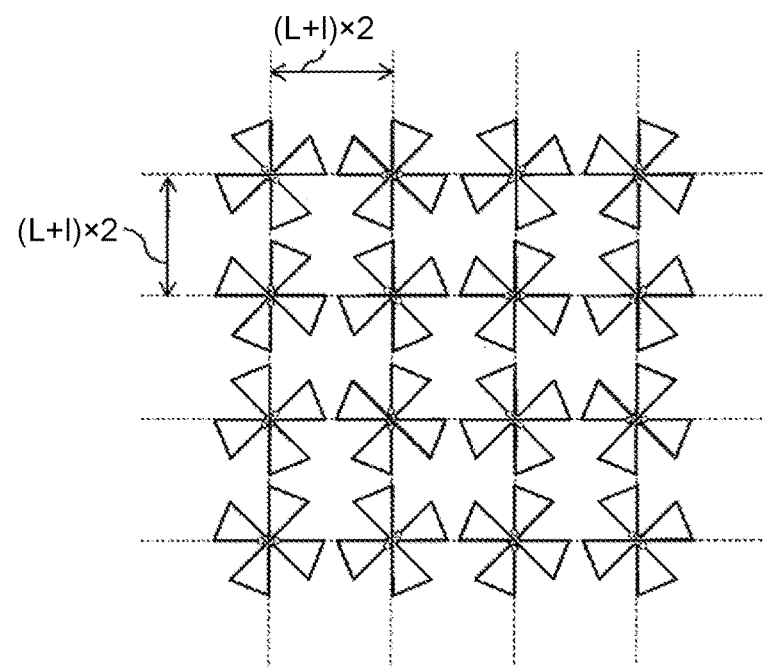
FIG. 9 illustrates an example in which multiple loops illustrated in FIG. 2 are disposed with the angle of rotation of each loop changed in the fourth embodiment.

FIG. 9 illustrates an example in which the coordinates of the center point of each loop are the same as those of FIG. 8, but the angle of rotation of each loop is changed. As shown in the first embodiment, for currents induced to a loop, depending on the angle with respect to a wiring line, there may be a case in which all currents are induced in the same direction and a case in which some induced currents are in an opposite direction and thus the sensitivity slightly decreases. By thus disposing the loops by changing the angle of each loop, a reduction in sensitivity can be prevented for wiring lines with all loops having the same angle.

Figure 10:
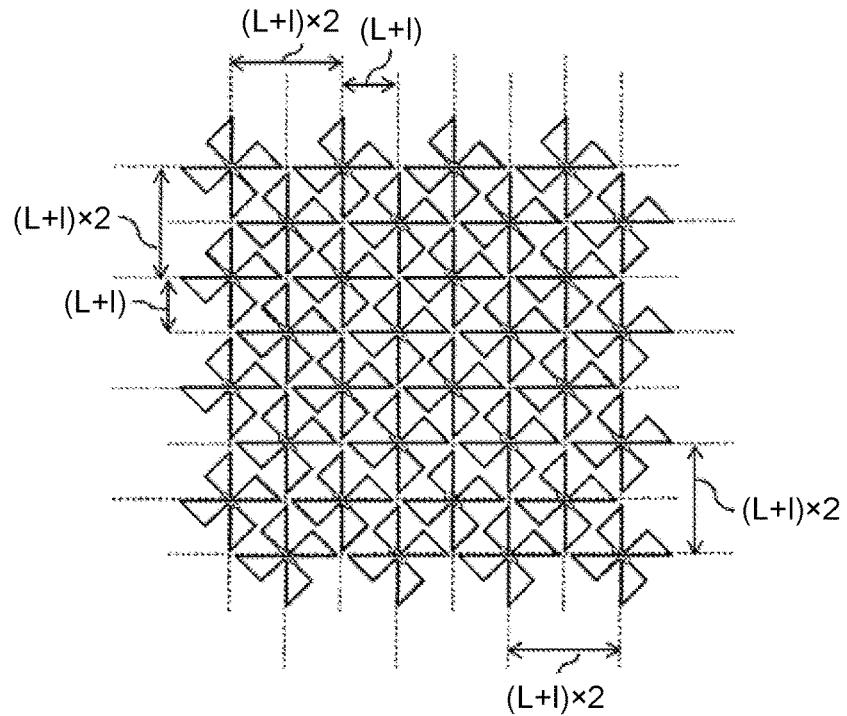
FIG. 10 illustrates an example of a case in which multiple loops illustrated in FIG. 5 are disposed in the same plane in the fourth embodiment.

Such a disposition may also be applied to the loop 2 of the structure shown in the second embodiment. FIG. 10 illustrates an example of a disposition method for a case of disposing multiple loops 2 of the structure illustrated in FIG. 5. FIG. 10 illustrates an example of a case in which the loops 2 are disposed in the same plane such that the {X, Y} coordinates of center points are located at {(L+I)×2n, (L+I)×2n} and {(L+I)×(2n+1), (L+I)×(2n+1)}, when a distance between an end point of each of four linear conductors of each loop 2 illustrated in FIG. 5 disposed at 0 degrees, 90 degrees, 180 degrees, and 270 degrees on the far side from the center point and the center point is L, minute spacing provided so that, when a plurality of loops 2 are disposed in a two-dimensional plane, the loops 2 do not contact each other (are not short-circuited) is I, and n is an integer.

Figure 11:
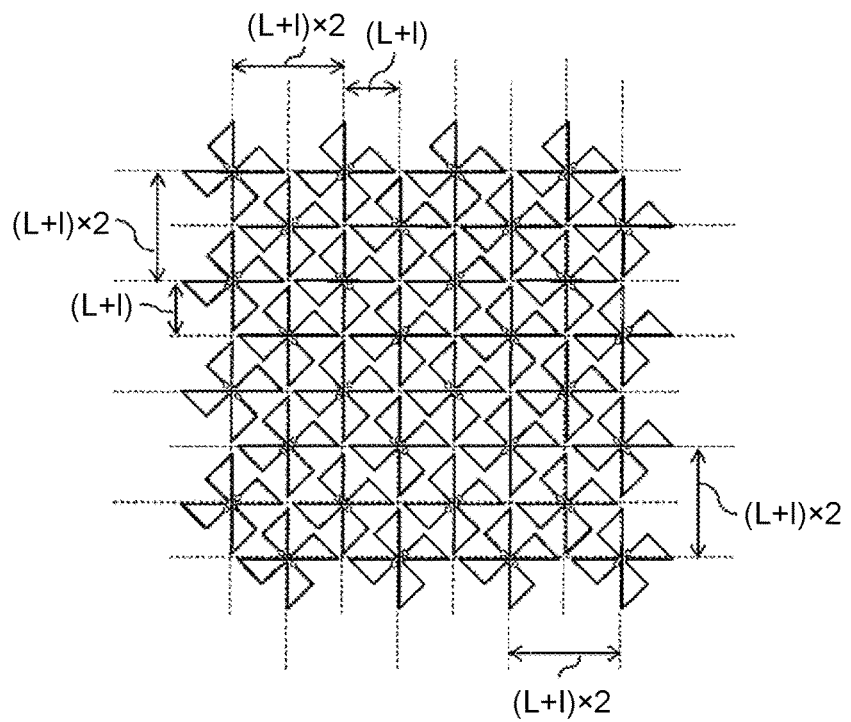
FIG. 11 illustrates an example in which multiple loops illustrated in FIG. 5 are disposed with the angle of rotation of each loop changed in the fourth embodiment.

FIG. 11 illustrates an example in which the coordinates of the center point of each loop are the same as those of FIG. 10, but the angle of rotation of each loop is changed. Here, in FIG. 11, by changing the angle of rotation of each loop, the orientations of terminals disposed are changed between the loops. Note that the angle of each loop is not limited to only 90 degrees, and may have any angle. As such, it is also possible to change the angle of rotation of each loop.

Furthermore, a plurality of planes, each of which has multiple loops disposed therein, such as those illustrated in FIGS. 10 and 11 may be stacked on top of each other, and the center positions or angles of rotation or both of the loops may be changed for each plane.

As such, an electromagnetic field probe of the present embodiment is characterized in that the electromagnetic field probe includes one layer in which a plurality of electromagnetic field probes are disposed. By this configuration, two-dimensional current distributions can be obtained at a time.

In addition, an electromagnetic field probe of the present embodiment is characterized in that the electromagnetic field probe includes a plurality of layers, each having a plurality of electromagnetic field probes disposed therein, and a plurality of electromagnetic field probes disposed in at least two layers among the plurality of layers have different center positions, different angles of rotation, or different sizes. By this configuration, two-dimensional current distributions can be more accurately obtained at a time.

REFERENCE SIGNS LIST 1, 2: loop, 10a to 10h: linear conductor, 11a, 11b: terminal, 20a to 20h: linear conductor, 21a, 21b: terminal, 30:

wiring line, 40: current, 50: magnetic flux, 61*a* to 61*d*, 62*a* to 62*d*, 63*a* to 63*d*, and 64*a* to 64*d*: induced current, 100: printed circuit board, 101: conductor pattern, 102: through-hole, 103*a*, 103*b*: terminal

The invention claimed is:

1. An electromagnetic field probe comprising one continuous conductor line having first and second terminals at respective ends of the one continuous conductor line and including 2N conductors radially extending from an end closer to a center of the electromagnetic field probe to an end farther from the center of the electromagnetic field probe, where N is an integer greater than or equal to 4, the one continuous conductor line being not short-circuited in middle and being formed by connecting an end portion of each conductor included in the 2N conductors to an end portion of another conductor included in the 2N conductors via a connecting conductor such that the one continuous conductor is formed by a plurality of connecting conductors in addition to the 2N conductors, wherein two conductors included in the 2N conductors are disposed at positions at which the two conductors face each other and respective end portions of the two conductors, which are closer to the center than the other respective end portions of the two conductors, are connected to each other, along the one continuous conductor line, an orientation of the n-th conductor away from the first terminal included in the 2N conductors and an orientation of the (n+1)-th conductor away from the first terminal have a 360/(2N)-degree angle difference, where n is selected from a set {1, 2, . . . , 2N−1}, each of the 2N conductors is a linear conductor, and the 2N conductors and the connecting conductors are substantially coplanar.

2. The electromagnetic field probe according to claim 1, wherein the n-th conductor and the (n+1)-th conductor are adjacent to each other, in each of N pairs, each including the (2m−1)-th and 2m-th conductors away from the first terminal along the one continuous conductor line, where m is selected from the set {1, 2, . . . , N}, the two conductors included in the pair have respective ends connected to each other, and each of the other respective ends of the two conductors is either connected to one of the first and second terminals at both ends of the one continuous conductor line or to an end of one of the two conductors included in a different pair.

3. The electromagnetic field probe according to claim 1, wherein odd-numbered conductors included in the 2N conductors have a first length and even-numbered conductors have a second length.

4. The electromagnetic field probe according to claim 3, wherein the first length is √2 times the second length, or is same as the second length.

5. An electromagnetic field probe comprising one continuous conductor line having first and second terminals at respective ends of the one continuous conductor line and including 2N conductors radially extending from an end closer to a center of the electromagnetic field probe to an end farther from the center of the electromagnetic field probe, where N is an integer greater than or equal to 4, the one continuous conductor line being not short-circuited in middle and being formed by connecting an end portion of a conductor included in the 2N conductors to an end portion of another conductor included in the 2N conductors, wherein two conductors included in the 2N conductors are disposed at positions at which the two conductors face each other and respective end portions of the two conductors, which are closer to the center than the other respective end portions of the two conductors, are connected to each other, along the one continuous conductor line, an orientation of the n-th conductor away from the first terminal included in the 2N conductors and an orientation of the (n+1)-th conductor away from the first terminal have a 360/(2N)-degree angle difference, where n is selected from a set {1, 2, . . . , 2N−1}, each of the 2N conductors is a linear conductor, the 2N conductors are substantially coplanar,

N=4, with regard to the p-th and (p+1)-th conductors away from the first terminal along the one continuous conductor line, where p is selected from the set {1, 3, 5, 7}, an end portion of the p-th conductor, which is farther from the center of the electromagnetic field probe than the other end portion of the p-th conductor, is connected to an end portion of the (p+1)-th conductor, which is farther from the center of the electromagnetic field probe than the other end portion of the (p+1)-th conductor, with regard to the q-th and (q+1)-th conductors away from the first terminal along the one continuous conductor line, where q is selected from the set {2, 6}, an end portion of the q-th conductor, which is closer to the center of the electromagnetic field probe than the other end portion of the q-th conductor, is connected to an end portion of the (q+1)-th conductor, which is closer to the center of the electromagnetic field probe than the other end portion of the (q+1)-th conductor, and with regard to the first and fifth conductors away from the first terminal along the one continuous conductor line, an end portion of the first conductor, which is closer to the center of the electromagnetic field probe than the other end portion of the first conductor, is connected to an end portion of the fifth conductor, which is closer to the center of the electromagnetic field probe than the other end portion of the fifth conductor.

6. The electromagnetic field probe according to claim 1, wherein a combination of respective end portions of the 2N conductors, which are closer to the center of the electromagnetic field probe than the respective other end portions of the 2N conductors, is present on a same circumference, or a combination of end portions of the 2N conductors, which are farther from the center of the electromagnetic field probe than the respective other end portions of the 2N conductors, is present on a same circumference.

7. The electromagnetic field probe according to claim 1, wherein the one continuous conductor line is formed in a same plane.

8. The electromagnetic field probe according to claim 1, wherein the one continuous conductor line is formed as a conductor pattern, the conductor pattern being a single layer of a printed circuit board.

9. An electromagnetic field probe comprising one layer in which a plurality of electromagnetic field probes according to claim 1 are disposed.

10. An electromagnetic field probe comprising a plurality of layers, each having a plurality of electromagnetic field probes according to claim 1 disposed in the layer, wherein a plurality of electromagnetic field probes disposed in at least two layers among the plurality of layers have different center positions, different angles of rotation, or different sizes.

11. An electromagnetic field probe comprising one continuous conductor line having first and second terminals at respective ends of the one continuous conductor line and including 2N conductors radially extending from an end closer to a center of the electromagnetic field probe to an end farther from the center of the electromagnetic field probe, where N is an integer greater than or equal to 4, the one continuous conductor line being not short-circuited in middle and being formed by connecting an end portion of a conductor included in the 2N conductors to an end portion of another conductor included in the 2N conductors, wherein
  two conductors included in the 2N conductors are disposed at positions at which the two conductors face each other and respective end portions of the two conductors, which are closer to the center than the other respective end portions of the two conductors, are connected to each other,
  along the one continuous conductor line, an orientation of the n-th conductor away from the first terminal included in the 2N conductors and an orientation of the (n+1)-th conductor away from the first terminal have a 360/(2N)-degree angle difference, where n is selected from a set $\{1, 2, \ldots, 2N-1\}$,
  each of the 2N conductors is a linear conductor,
  the 2N conductors are substantially coplanar,
  N=4,
  with regard to the p-th and (p+1)-th conductors away from the first terminal along the one continuous conductor line, where p is selected from the set $\{1, 3, 5, 7\}$, an end portion of the p-th conductor, which is farther from the center of the electromagnetic field probe than the other end portion of the p-th conductor, is connected to an end portion of the (p+1)-th conductor, which is farther from the center of the electromagnetic field probe than the other end portion of the (p+1)-th conductor,
  with regard to the q-th and (q+2)-th conductors away from the first terminal along the one continuous conductor line, where q is selected from the set $\{2, 6\}$, an end portion of the q-th conductor, which is closes to the center of the electromagnetic field probe than the other end portion of the q-th conductor, is connected to an end portion of the (q+2)-th conductor, which is closer to the center of the electromagnetic field probe than the other end portion of the (q+2)-th conductor, and
  with regard to the first and fifth conductors away from the first terminal along the one continuous conductor line, an end portion of the first conductor, which is closer to the center of the electromagnetic field probe than the other end portion of the first conductor, is connected to an end portion of the fifth conductor, which is closer to the center of the electromagnetic field probe than the other end portion of the fifth conductor.

* * * * *